United States Patent [19]

Williams, Jr.

[11] Patent Number: 4,546,388
[45] Date of Patent: Oct. 8, 1985

[54] POWER SUPPLY FOR CRT TERMINAL
[75] Inventor: Errol R. Williams, Jr., Round Rock, Tex.
[73] Assignee: Rolm Corporation, Santa Clara, Calif.
[21] Appl. No.: 451,081
[22] Filed: Dec. 20, 1982
[51] Int. Cl.⁴ .............................................. H04N 3/18
[52] U.S. Cl. ................................... 358/190; 358/243; 315/411
[58] Field of Search ........................ 358/190, 243, 188; 315/408, 411, 389, 399; 363/20, 21, 41, 97, 25, 26

[56] References Cited
U.S. PATENT DOCUMENTS

| | | | |
|---|---|---|---|
| 3,818,128 | 6/1974 | Chambers et al. | 358/190 |
| 3,979,640 | 9/1976 | Fischman et al. | 315/408 |
| 4,321,512 | 3/1982 | Alvord et al. | 358/190 |
| 4,398,133 | 8/1983 | Beaumant et al. | 358/190 |

Primary Examiner—Tommy P. Chin
Assistant Examiner—Michael D. Parker
Attorney, Agent, or Firm—Blakely, Sokoloff, Taylor & Zafman

[57] ABSTRACT

The power supply of the present invention simultaneously provides multiple regulated power outputs for the digital circuitry within CRT terminals and a stable current sawtooth waveform suitable for driving a magnetic deflection yoke. The power supply comprises a high voltage transformer connected to a horizontal yoke to drive the CRT beam and a low voltage transformer which drives a microprocessor, communication circuitry, and the various other components of the power supply circuit. There is only one set of control switching, start up and protection components that drive the high voltage and low voltage transformers. The power supply provides a horizontal sync signal which is always locked onto the CRT monitor and also provides a steady voltage output to drive the CRT microprocessor.

11 Claims, 2 Drawing Figures

POWER SUPPLY FOR CRT TERMINAL

BACKGROUND OF THE INVENTION

I. Field of the Invention

This invention relates to CRT terminals, more specifically, the power supplies which drive the terminals and the other digital circuits therein.

II. Prior Art

There are many ways to drive CRT terminals known in the art. The most common method is to couple two power supplies together. One power supply provides regulated DC voltages which drive all the digital circuits such as a microprocessor, screen memory, and communication circuitry within the CRT terminal and the other power supply provides the CRT bias voltages and the power for the deflection yoke which control the CRT's beam's deflection on the screen. Each power supply has similar control switching, start up and protection components. As a result, there is a great redundancy in the two power supply circuits used to drive the CRT terminal.

Therefore, a single power supply that can drive the multiple power regulated outputs and a stable current sawtooth waveform suitable for driving a magnetic deflection yoke would be a substantial advance in the art.

SUMMARY OF THE INVENTION

The power supply of the present invention simultaneously provides multiple regulated power outputs for the digital circuitry within CRT terminals and a stable current sawtooth waveform suitable for driving a magnetic deflection yoke.

The power supply comprises a high voltage transformer connected to a horizontal yoke to drive the CRT beam and a low voltage transformer which drives a microprocessor, communication circuitry, and the various other components of the power supply circuit. The primary winding of the low voltage transformer is connected between a variable direct current input and the collector of a transistor. The secondary winding is connected to the multiple power outputs. The output connected to the microprocessor is fed back to an error amplifier which generates an error voltage whenever there is a difference between the output voltage and a steady reference voltage which is caused by the variation in the direct current input. The error voltage is applied to a pulse width modulator to modulate the width of an output signal it receives from a phase locked loop. The loop output signal is generated by the phase locked loop and is adjusted so that the output signal received from the horizontal yoke is in phase with a horizontal sync signal received from the microprocessor. The modulated signal from the pulse width modulator is applied to the base of the transistor. The transistor switches on when the modulated signal is high and switches off when the modulated signal is low.

When the transistor is on, energy is stored in the primary winding of the low voltage transformer. When the transistor is off, the energy stored in the primary winding is applied to the multiple power outputs. Since one of the power outputs drives the high voltage transformer, the amplitude of the horizontal yoke current is also controlled. Thus, by varying the width of the modulated signal and synchronizing the signal to a steady sync signal, the output voltage to the microprocessor is regulated and the horizontal yoke current is maintained at a constant level.

Thus, unlike prior art power supplies, there is only one set of control switching, start up and protection components that drive the high voltage and low voltage transformers. The power supply provides a sawtooth yoke waveform which is always locked onto the horizontal sync signal and also provides a steady voltage output to drive the CRT microprocessor.

DETAILED DESCRIPTION OF THE INVENTION

Figure 1:
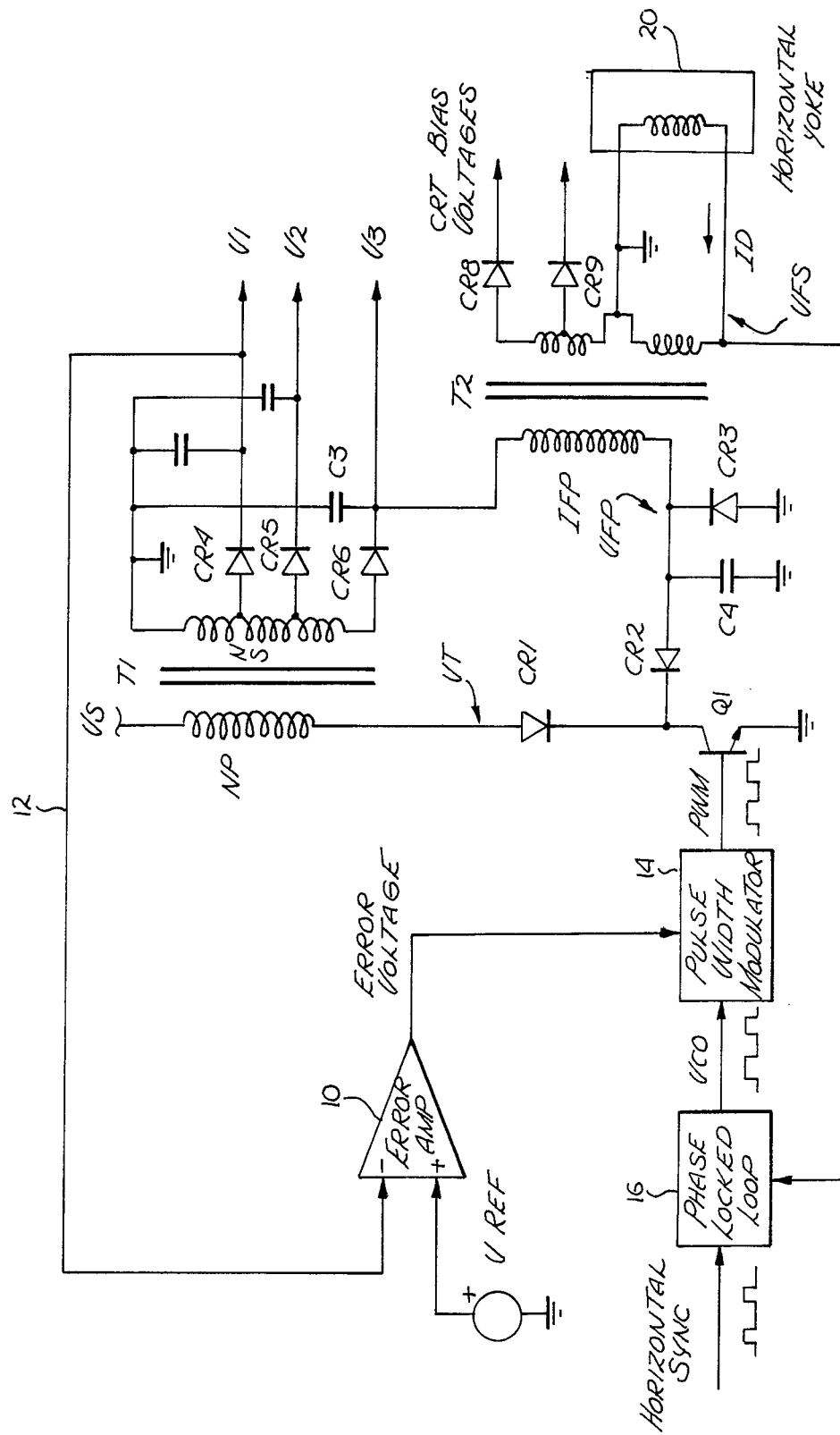
FIG. 1 is a diagram of the power supply circuit for a CRT in accordance with the present invention.

A power supply circuit for a CRT terminal is described which simultaneously provides multiple regulated power outputs and a stable current sawtooth waveform suitable for driving a magnetic deflection yoke. In the following description numerous specific details are set forth, such as specific circuits, in order to provide a thorough understanding of the present invention. It will be obvious, however, to one skilled in the art that the present invention may be practiced without these specific details. In other instances, well-known circuits such as a phase locked loop circuit are not described in detail in order not to unnecessarily obscure the present invention. In the presently preferred embodiment, transformer T1 is a low voltage pulse transformer whose primary winding Np is connected from a variable direct current power input Vs to the collector of a transistor Q1 through rectifier CR1. The secondary winding Ns of transformer T1 is connected to multiple power outputs V1, V2 and V3, through rectifiers CR4, CR5 and CR6 respectively. Also connected to outputs V1, V2 and V3 are filter capacitors C1, C2, and C3, respectively, which hold the output voltages steady while transformer T1 switches on and off.

The outputs V1, V2 and V3 supply power to all the digital circuits connected to the power supply. For example, output V1 is connected to the microprocessor which handles all the communication between the host and the CRT terminal. Therefore, the output V1 has to be controlled more stringently than the other outputs V2 and V3. The microprocessor may be run off either of the other two outputs V2 or V3 with suitable modifications of the power circuit. However, V1 is selected in the preferred embodiment to create a simpler circuit design. The communication circuitry connected to the microprocessor is connected to output V2. Voltage V3 drives the transformer T2 of the magnetic deflection yoke 20.

The variable input affects the amount of energy applied to the outputs. Therefore, the power supply circuit compensates for any change in amplitude of the input voltage. Since V1 is the most critical output, it is used to determine the amount of compensation that needs to be made for any variance in the input voltage. Therefore, the output voltage V1 is fed back into error amplifier 10 through feedback loop 12. Error amplifier 10 compares the output voltage V1 to a steady precision reference voltage Vref to determine if there is any difference in the two voltages. An error signal is generated by the error amplifier 10 if there is a difference in the voltages and applied to a pulse width modulator 14. The pulse width modulator 14 also receives a Vco signal from phase locked loop 16. Phase locked loop 16 is also connected to horizontal yoke 18 and the microprocessor (not shown). The Vco signal generated by the phase locked loop 16 is a signal that adjusts itself so that the horizontal yoke voltage Vfs generated by the horizontal yoke 18 is synchronized (in phase) with a steady HORIZONTAL SYNC signal from the microprocessor circuitry. The pulse width modulator 14 widens the pulse of the Vco signal proportional to the amplitude of the error signal in order to generate a PWM pulse train which is shown in FIG. 2.

The pulse width modulator 14 is connected to the base of transistor Q1 which turns on and off in response to the PWM pulse received therefrom. The collector of transistor Q1 is connected to rectifiers CR1 and CR2. Rectifier CR2 is connected to the constant output voltage V3 through the primary winding of the high voltage flyback transformer T2. Transformer T2 drives the horizontal yoke 20 in response to voltage V3 which is applied thereto. One of the secondary windings of transformer T2 is connected to rectifiers CR7 and CR8 which provide the CRT bias voltages which control the on and off of the beam in the CRT. The other secondary winding is connected across horizontal deflection yoke 20 and to the first secondary winding. The primary winding of transformer T2 is also connected to rectifier CR3 and capacitor C4. Capacitor C4 is a resonant capacitor which together with the primary inductance of transformer T2 determines the flyback time of the horizontal yoke 20, the width of the voltage Vfp across the primary winding. The combination of the horizontal yoke 20 and high voltage flyback transformer T2 operates as a conventional "resonant sweep" circuit which is extensively used in horizontal deflection sections of television receivers and CRT monitors.

Figure 2:
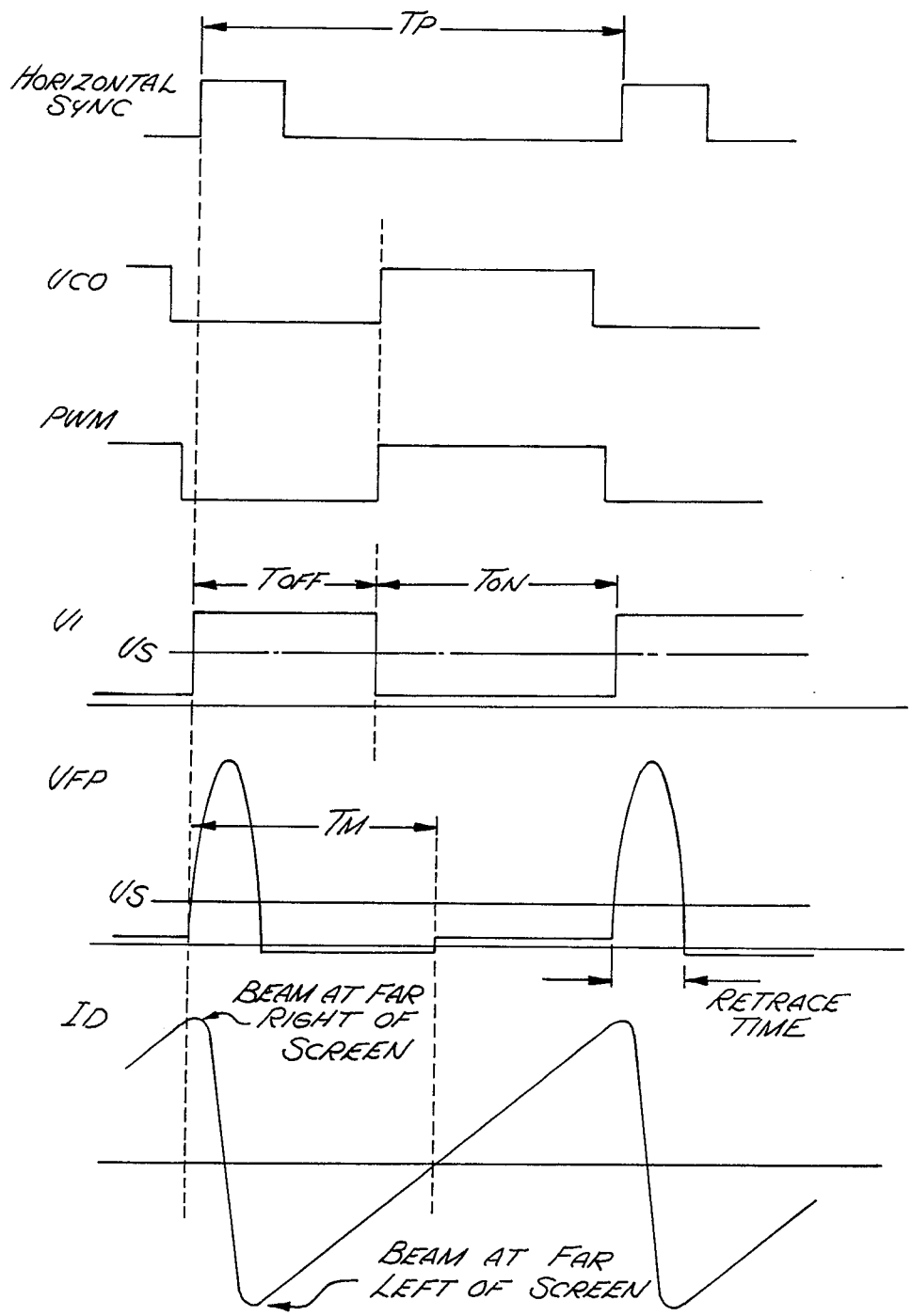
FIG. 2 is an illustration of the waveform outputs of various components of the circuit in FIG. 1.

Referring next to FIGS. 1 and 2, the operation of the power supply circuit for a CRT terminal will be discussed. When the power supply is turned on, the voltage Vs is applied to transformer T1 from a variable direct current power source which drives the base of transistor Q1. As a result, transistor Q1 starts oscillating. At the same time, transformer T1 generates the output voltages V1, V2 and V3 which start to increase from zero to their maximum voltages. In the preferred embodiment, voltages V1, V2 and V3 are +5v, +12v and +24v respectively.

As voltages V1, V2 and V3 increase, they drive the digital circuits connected thereto and the microprocessor through a plurality of lines (not shown). Further, the voltages are applied to the phase locked loop 16, the error amplifier 10 and the pulse width modulator 14 so that the circuit can begin to operate. Voltage V3 drives the transformer T2 which drives the horizontal yoke 20. The horizontal yoke then generates the output yoke voltage Vfs which is applied to the phase locked loop 16. The phase locked loop 16 begins to oscillate when it receives the yoke voltage Vfs to provide the Vco pulse. However upon start up of the circuit, the horizontal yoke voltage Vfs is not synchronized with the HORIZONTAL SYNC.

After the phase locked loop 16 provides the desired Vco pulse, the critical output voltage V1 is regulated at its maximum level i.e. ±5 v. As a result, the phase locked loop 16 adjusts the Vco output so that the leading edge of the yoke voltage Vfs is synchronized with the leading edge of the HORIZONTAL SYNC signal. Thus the power supply circuit is at full operating capacity. At the same time, output voltage V1 is regulated by the control loop to be very close to the level of the reference voltage Vref by changing the pulse width of the PWM signal in accordance with the error signal generated by error amplifier 10. The amplitude of the error signal will vary according to the variance of the input voltage Vs.

The PWM pulse signal has a leading edge which is concurrent with the leading edge of the Vco signal. The PWM signal is applied to the base of transistor Q1 to turn the transistor on when PWM is high or turn the transistor Q1 off when PWM is low. This is a conventional technique commonly used in switching voltage regulators, and the approximate relationship of voltages to duty cycle i.e. the time Q1 is on or off, is known to be:

$$V1 = Vs(Nsl/Np)(Ton/Toff)$$

where Nsl and Np are the number of secondary and primary turns respectively of transformer T1, and Ton and Toff are the lengths of time T1 is on or off respectively as indicated in FIG. 2.

When transistor Q1 is on, the current from power source Vs flows through its collector into forward biased rectifier CR1 and is stored in the primary coil inductance Np of transformer T1. When Q1 is turned off, the stored energy in the coil Np goes to outputs V1, V2 and V3. The longer the duty cycle, the more energy that is stored in T1 which results in a higher voltage at the V1 output. Thus, when Vs decreases, it takes longer to store the same amount of energy and the width of the PWM pulse increases.

Output voltages V2 and V3 are not regulated directly, but due to the close magnetic coupling of the turns in transformer T1 and the somewhat predictable forward biased voltages of rectifiers CR4, CR5 and CR6, these two outputs can be maintained within a tolerance of a few percent.

Horizontal retrace begins at the leading edge of the HORIZONTAL SYNC signal as shown in FIG. 2. The primary current Ifp across transformer T2 has essentially the same shape as the horizontal yoke deflection current Id except for a difference in magnitude by the factor of Nfs/Nfp where Nfs and Nfp is the number of secondary and primary turns respectively of transformer T2. Similarily, the voltage Vfp is larger than the voltage Vfs by a factor of Nfp/Nfs.

During the horizontal retrace of the CRT sine waveform, the current Ifp rapidly changes from a maximum positive value to a maximum negative value. Beginning at the end of the retrace time and continuing throughout the linear portion of the sawtooth waveform Id, the voltage Vfp across the primary winding of transformer T2 is approximately constant and equal to the voltage V3. Since the impedance at the terminals of the primary winding of transformer T2 is almost purely inductive, the current Id increases with constant slope, providing the desired linear sweep. The sawtooth current waveform Id must be maintained at a constant amplitude since it is driving the horizontal yoke and the CRT display.

When the current Ifp is negative, it flows from a forward biased rectifier CR3 into the V3 output where it is stored in capacitor C3. When the current Ifp is positive, it cannot flow through CR3. Therefore, the only path the current can take is through CR2 into transistor Q1. Therefore, the transistor Q1 must always be on when yoke deflection current Id is positive to have a path for the current to go. As a result, Id must be the same phase as the horizontal sync signal so that transistor Q1 is on when Id is positive. When rectifier CR3 stops conducting and transistor Q1 and CR2 start conducting, there is a small discontinuity in the center of the Vfp waveform as shown in FIG. 2. As Id continues to increase to its maximum amplitude, transistor Q1 will switch off causing the flyback waveform. The cycle is continuously repeated while adjusting for the variable power input.

Unlike previous prior art power circuits for CRT terminals, this new improved circuit is able to generate an unaltering linear current sweep waveform for the CRT while simultaneously regulating power output voltages generated by a widely varying unregulated input voltage using a single power supply. In order for the waveform to be maintained at a constant level, Toff is always less than Ton, or, in other words, transistor Q1 must be always on when current Ifp through the transformer T2's primary winding is positive. Since the circuit only uses one power source to generate both the power outputs and the CRT waveform, there is a lower production cost, smaller product size, and higher product reliablity because fewer components are required.

Thus has been described a power supply circuit for a CRT terminal. While the invention has been described in relation to a particular embodiment thereof, it should be understood that suitable modifications and changes may be made in the design of the invention without departing from the spirit and scope thereof.

What is claimed is:

1. A power supply for a CRT terminal responsive to a widely varying input power, comprising:
    magnetic yoke means for deflecting a beam of said CRT;
    low voltage means coupled to said input power, said low voltage means for generating a plurality of power outputs;
    high voltage means for generating a sawtooth waveform suitable for driving said magnetic yoke means, said high voltage means deriving power from said low voltage means;
    controlling means coupled to said high voltage means and said low voltage means, said controlling means controlling said high voltage means and said low voltage means, such that at least one of said plurality of power outputs and said waveform remain unaltered as said input power varies.

2. The power supply of claim 1, further comprising:
    synchronizing means for generating a synchronous waveform coupled to said controlling means, said magnetic yoke means and a video circuit of said CRT terminal, such that said synchronizing means synchronizes said sawtooth waveform of said magnetic yoke means to a horizontal synchronizing signal of said video circuit and provides a synchronized control signal to said controlling means for controlling said high voltage means and said low voltage means.

3. The power supply of claim 2, further comprising: error detecting means for comparing one of said plurality of power outputs to a reference signal of said CRT terminal, such that said error detecting means generating a correcting signal to said controlling means when one of said plurality of power outputs varies from said reference signal.

4. A power supply for a CRT terminal responsive to a widely varying input power, comprising:
    horizontal yoke means for deflecting a beam of said CRT, and for generating a yoke output signal,
    low voltage means coupled to said input power, said low voltage means for generating a first output and a plurality of second outputs,
    high voltage means for generating a plurality of CRT bias voltages and a waveform for driving said horizontal yoke means, said high voltage means deriving power from said second outputs of said low voltage means;
    controlling means coupled to said high voltage means and said low voltage means, said controlling means for providing a timing sequence for energizing said high voltage means and said low voltage means, such that said first output of said low voltage means and said waveform of said horizontal yoke means remain unaltered as said input power varies.

5. The power supply of claim 4, further comprising:
    synchronizing means coupled to said controlling means, said horizontal yoke means and a video circuit of said CRT terminal, such that said synchronizing means synchronizes said waveform of said horizontal yoke means to a horizontal synchronizing signal of said video circuit and providing a synchronized phase-locked control signal to said controlling means for controlling said high voltage means and said low voltage means.

6. The power supply of claim 5, further comprising error detecting means for comparing said first output to a reference signal of said CRT terminal, such that a correcting signal is provided to said controlling means when said first output varies from said reference signal.

7. A power supply circuit for a CRT terminal responsive to a variable DC input, comprising:
    a magnetic yoke for deflecting a beam of said CRT;
    low voltage means, said low voltage means further including a first transformer including a primary winding coupled to said input power, a secondary winding for generating a plurality of outputs including a first output and a second output;
    high voltage means, said high voltage means further including a second transformer having a primary winding coupled to said second output, and a secondary winding for generating a plurality of CRT bias voltages and a sawtooth waveform for driving said magnetic yoke;
    controlling means coupled to said first transformer's primary winding and said second transformer's primary winding, said controlling means including a pulse-width modulator for providing a timing sequence for energizing said high voltage means and said low voltage means, such that said first output and said sawtooth waveform remain unaltered as said input power varies.

8. The power supply of claim 7, further comprising:
    synchronizing means coupled to said pulse-width modulator, said magnetic yoke means and a video circuit of said CRT terminal, such that said synchronizing means synchronizes said sawtooth waveform of said magnetic yoke means to a horizontal synchronizing signal of said video circuit and provides a synchronized phase-locked control signal to said pulse-width modulator for providing said timing sequence 9. The power supply of claim 8, further comprising error detecting means for comparing said first output to a reference signal of said CRT terminal, such that said error detecting means for generates a correcting signal to said pulse-width modulator when said first output varies from said reference signal, said correcting signal modulating the width of said synchronized phase-locked control signal such that a pulse-width modulated signal is provided.

10. The controlling means of claim 9, further including a driver, said driver coupled to said pulse-width modulator, said first transformer's primary winding and said second transformer primary winding, said driver for controlling current flow in said primary windings by turning on and off in response to said pulse-width modulated signal of said pulse-width modulator.

11. The power supply of claim 10, wherein said input power includes singular DC power.

* * * * *